United States Patent
Ozeki

(10) Patent No.: US 6,208,580 B1
(45) Date of Patent: Mar. 27, 2001

(54) SEMICONDUCTOR STORAGE DEVICE INCLUDING COLUMN PRE-DECODER CIRCUIT FOR PREVENTING MULTIPLE SELECTION OF BIT LINES

(75) Inventor: Seiji Ozeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/464,396

(22) Filed: Dec. 16, 1999

(30) Foreign Application Priority Data

Dec. 24, 1998 (JP) .................................. 10-368193

(51) Int. Cl.$^7$ ...................................................... G11C 8/00
(52) U.S. Cl. ................................ 365/230.06; 365/230.08; 365/233
(58) Field of Search .................... 365/230.06, 230.08, 365/233

(56) References Cited

U.S. PATENT DOCUMENTS 5,923,604 * 7/1999 Wright et al. .................. 365/230.02
5,970,022 * 5/2000 Hoang .............................. 365/233.5
6,064,622 * 5/2000 Lee et al. ........................ 365/230.06

* cited by examiner

Primary Examiner—David Nelms
Assistant Examiner—Connie C. Yoha
(74) Attorney, Agent, or Firm—Sughrue, Mion, Zinn, Macpeak & Seas, PLLC

(57) ABSTRACT

A semiconductor storage device (e.g., synchronous DRAM) is configured using a memory cell array on which memory cells are arranged in a matrix form using word lines and bit lines respectively corresponding to rows and columns, which are designated based on address signals being given from the external. Herein, a row address buffer circuit inputs the address signals in synchronization with an external clock signal to provide a row address signal, which is decoded by a row decoder circuit to selectively activate a corresponding word line. Similarly, a column address buffer circuit inputs the address signals to provide a column address signal, which is converted to internal signals designating continuing column addresses of a prescribed burst length. In addition, a column pre-decoder circuit pre-decodes the internal signals in response to a pulse signal so as to produce column address pre-decode signals, which are decoded by a column decoder circuit to produce column selecting signals. Each pair of adjoining bit lines are connected with a sense amplifier and are further connected to data lines by way of each pair of column selecting transistors, which are controlled in conduction in response to each of the column selecting signals. Incidentally, the column pre-decoder circuit retains states of previous internal signals thereof to inactivate present internal signals during a predetermined duration, which substantially corresponds to a pulse width of the pulse signal.

7 Claims, 9 Drawing Sheets

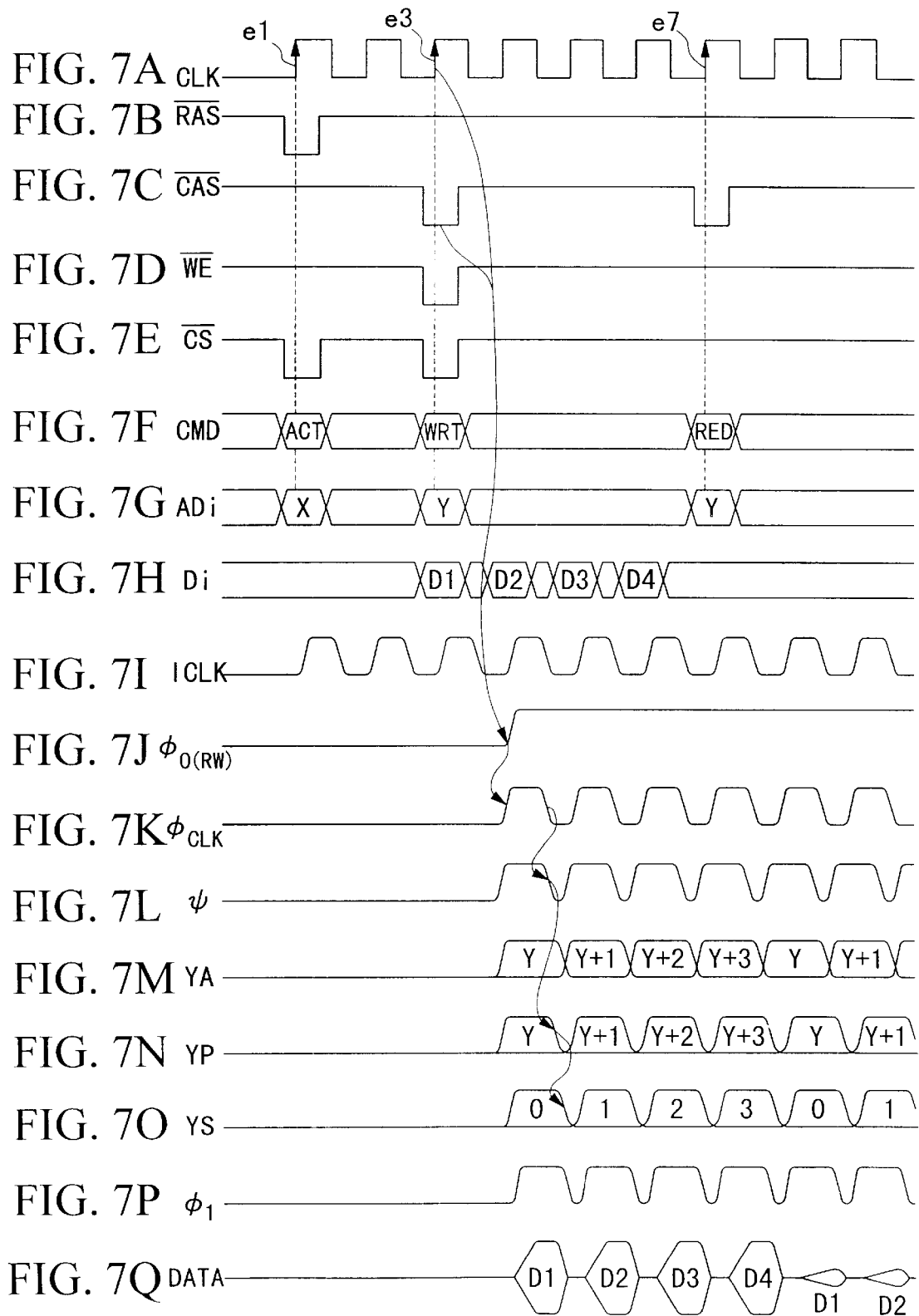

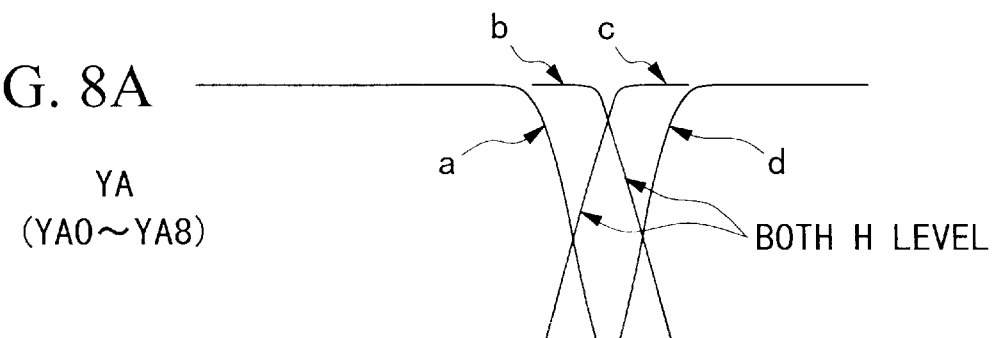
FIG. 8A  YA (YA0~YA8)
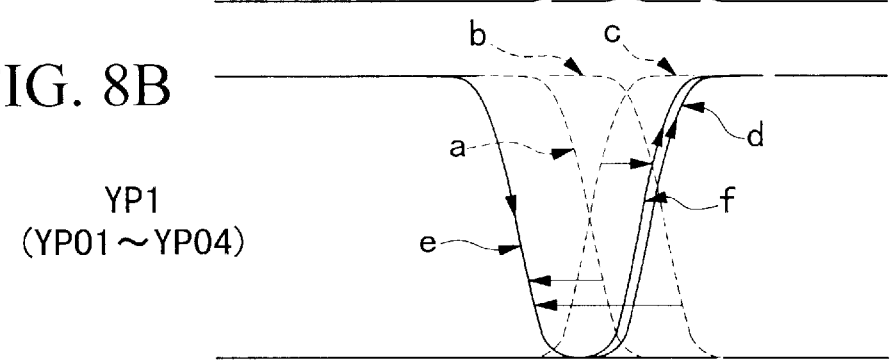
FIG. 8B  YP1 (YP01~YP04)
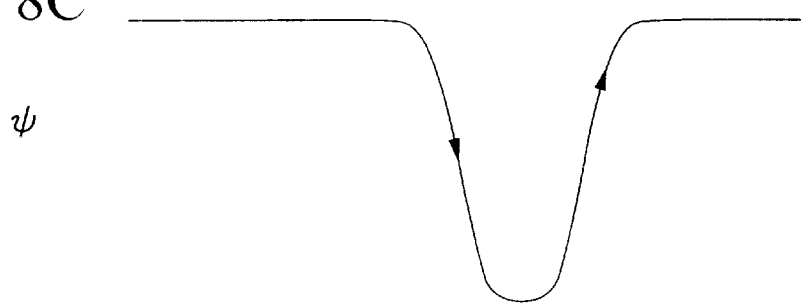
FIG. 8C  ψ
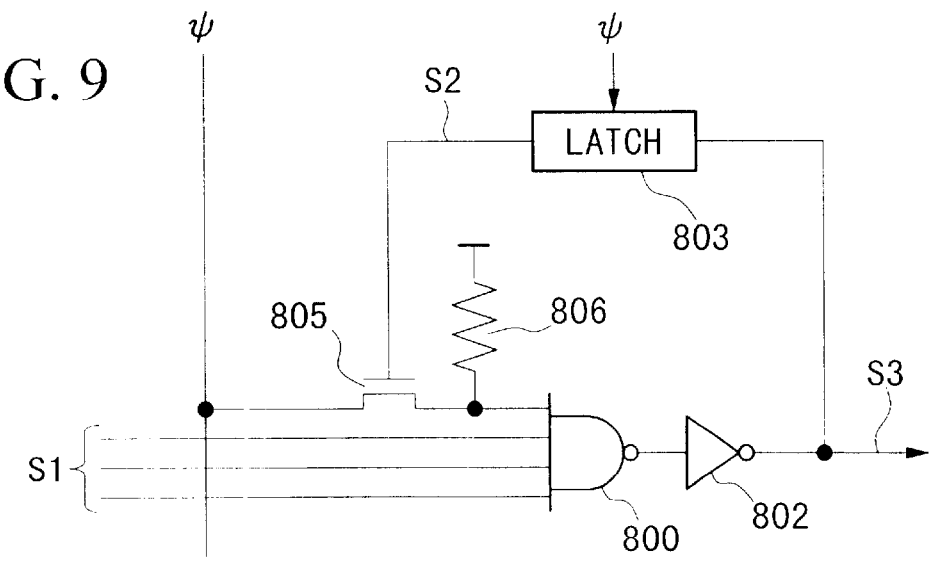
FIG. 9

FIG. 10A  ψ
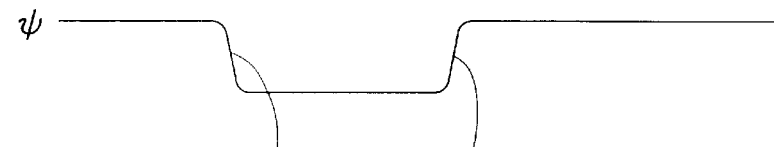
FIG. 10B  S1
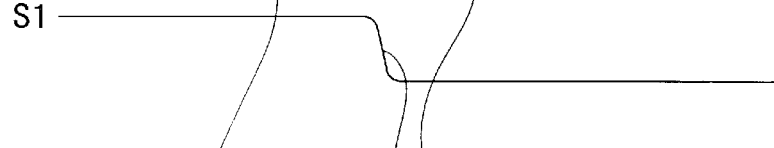
FIG. 10C  S2
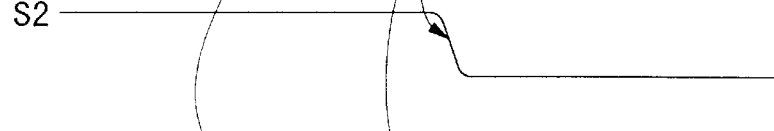
FIG. 10D  S3
FIG. 10E  ψ
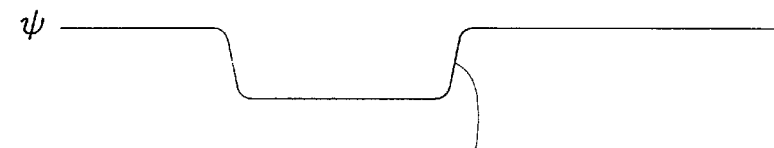
FIG. 10F  S1
FIG. 10G  S2
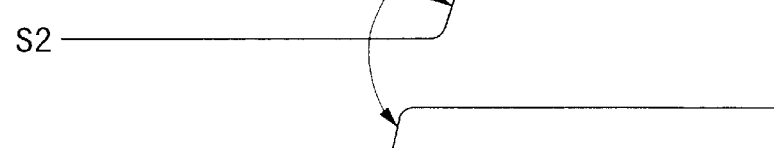
FIG. 10H  S3
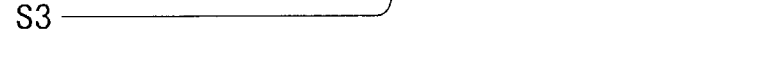

US 6,208,580 B1

SEMICONDUCTOR STORAGE DEVICE INCLUDING COLUMN PRE-DECODER CIRCUIT FOR PREVENTING MULTIPLE SELECTION OF BIT LINES

BACKGROUND OF THE INVENTION

1. Field of the Invention

This invention relates to semiconductor storage devices such as synchronous dynamic random-access memories.

This application is based on Patent Application No. Hei 10-368193 filed in Japan, the content of which is incorporated herein by reference.

2. Description of the Related Art

In the semiconductor storage devices such as synchronous dynamic random-access memories (i.e., synchronous DRAMs), memory cells each storing a single bit, which is a minimum unit of data, are arranged in a matrix form and are connected together using word lines and bit lines. Herein, the bit lines are arbitrarily selected after the word lines are activated based on address signals given from the external (i.e., external device or system), so that read/write operations of data are performed on the memory cells by way of the selected bit lines.

Next, an example of a configuration of the conventional semiconductor storage device will be described by giving attention to the bit line(s) being selected.

Now, a basic configuration of the semiconductor storage device will be described with reference to FIG. 2, details of which will be described later.

In FIG. 2, memory cells "MC" are arranged in a memory cell array, wherein word lines "WL" are laid in directions of rows, while bit lines "BL" are laid in directions of columns. So, each memory cell MC is connected between the corresponding word line and bit line. To avoid an event in which the memory cells respectively connected to adjoining bit lines are simultaneously selected, each of the word lines is connected only with the memory cells, which belong to an odd-numbered column or an even-numbered column in the memory cell array consisting of rows and columns.

In addition, a single sense amplifier "SA" (e.g., SA0) is provided for two adjoining bit lines "BL" (e.g., BL0 and BL1). Herein, the sense amplifier SA is of a latch type, which is configured mainly by a flip-flop circuit. The sense amplifier is activated at a predetermined timing to sense (or latch) and amplify a weak data signal, which is given from the memory cell MC on the bit line BL.

Each of the bit lines BL is connected to a data line DB (i.e., DBa, DBb) by way of a column selecting transistor T (i.e., T01 to T32). Herein, a pair of bit lines connected to a same sense amplifier are connected to two data lines by two column selecting transistors respectively. Each column selecting transistor is turned on by a column selecting signal YS (i.e., YS01–YS04) so that each bit line is connected to the corresponding data line.

The data lines are connected to a data amplifier 410. The data amplifier 410 amplifies the data signal of the memory cell MC which appears on the data line. In the example of FIG. 2, eight bit lines BL0 to BL7 are collectively connected to the data amplifier 410 as one unit, which is repeated in the memory cell array. So, 512 bit lines are provided in the memory cell array in total.

FIG. 11 shows an example of a decoder circuit, which is conventionally used to produce the aforementioned column selecting signals by decoding column address signals being input from the external. In FIG. 11, column pre-decoders 321A to 323A perform pre-decoding on column address signals YA0 to YA8, which are input thereto by way of an address buffer circuit (not shown). Herein, each pre-decoder is activated to operate by a buffering signal $\phi_0$.

A column decoder 330A decodes output signals of the column pre-decoders 321A to 323A to produce column selecting signals YS01 to YS04, which are used to control conductions of the column selecting transistors. There are provided sixty-four column decoders in total. Each column decoder (330A) is configured to specify any one of the column selecting signals YS01 to YS04 in response to the output signals of the column pre-decoder 321A. So, only one of the sixty-four column decoders is activated in response to the output signals of the column pre-decoders 322A and 323A.

Namely, the decoder circuit of FIG. 11 outputs 256 column selecting signals in total. Herein, only one of the column selecting signals is activated in response to the column address signal given from the external. There are provided two sets of the decoder circuit shown in FIG. 11, which output 512 column selecting signals in total. Each set is selected by the address signal YA8. Then, one of the 512 column selecting signals is selected at last.

In the aforementioned semiconductor storage device, the column selecting signals "YS" (i.e., YS01–YS04) output from the column decoder 330A make transition in synchronization with the column address signals input to the column pre-decoders 321A to 323A. Herein, each column selecting signal selects a pair of bit lines by controlling conductions of the column selecting transistors.

In order to minimize time lags (or deviations) in timing between column address signals due to wiring load, the conventional semiconductor storage device is designed such that the address buffer circuits are arranged on a chip in a concentrated manner, so that lengths of wires laid between the address buffer circuits and column pre-decoders are adjusted to be substantially identical to each other. To cope with increasing capacities of memories, it is necessary to reduce wiring areas as minimally as possible. In order to do so, wires used for the column address signals of the address buffer circuits are formed as groups, which are arranged adjacent to each other.

If the wires used for the column address signals are arranged to be adjacent to each other, a coupling capacity (or coupling capacitor) is formed between the wires. So, crosstalk is caused to occur between the wires due to the coupling capacity. In addition, a time lag is caused to occur in timing between the column address signals being input to the column pre-decoders, so that a time lag is correspondingly caused to occur in timing between the column selecting signals being output from the column decoder. This may cause a multiple selection of bit lines in which multiple (pairs of) bit lines are simultaneously selected.

Next, a description will be given with respect to a mechanism in which a time lag is caused to occur in timing between the column address signals due to the coupling capacity being formed between the wires. Herein, the description will be given concretely with attention to two adjoining wires. Suppose that column address signals on the two adjoining wires make level transition in a same direction, in which both of the column address signal change in level from L level (or low level) to H level (or high level) or from H level to L level. In that case, an electric potential difference is retained substantially constant between terminals of the coupling capacity being formed between the wires. So, there is almost no probability in which the coupling capacity is charged or discharged due to level transition of the column address signals. Therefore, the coupling capacity does not become apparent, so the column address signals on the wires are transmitted at a high speed without being influenced by the coupling capacity.

In contrast, if the column address signals on the two adjoining wires make level transition in different directions respectively, or if only one of the column address signals makes level transition, the coupling capacity must be charged or discharged, so that the coupling capacity becomes apparent. In that case, the column address signals on the wires are influenced by the coupling capacity, so time lags are caused to occur in timing between the column address signals as shown in FIG. 12A. Due to such time lags between the column address signals, time lags as show in FIG. 12B are correspondingly caused to occur in timing between output signals (or column selecting signals) of the column pre-decoders, which make transition in synchronization with the column address signals.

In FIG. 12A, reference symbols YFD, YFU show waveforms, which are related to a "high-speed" column address signal whose propagation speed is the fastest within the column address signals (YA0–YA8). That is, YFD shows a rise-up waveform of the high-speed column address signal, while YFU shows a fall-down waveform of the high-speed column address signal. In addition, reference symbols YLU, YLD show waveforms, which are related to a "low-speed" column address signal whose propagation speed is the lowest within the column address signals. That is, YLU shows a rise-up waveform of the low-speed column address signal, while YLD shows a fall-down waveform of the low-speed column address signal. In FIG. 12B, reference symbols PFD, PFU, PLU and PLD show output waveforms of the column pre-decoders. That is, the waveforms PFD, PFU are output in response to the waveforms YFD, YFU respectively, while the waveforms PLU, PLD are output in response to the waveforms YLU, YLD respectively.

Suppose that signals output from the column pre-decoders make level transition along the waveforms PFU, PLD respectively. In that case, multiple column selecting signals are instantaneously (or simultaneously) activated, so the bit lines are subjected to multiple selection. In contrast, in the case where signals output from the column pre-decoders make level transition along the waveforms PFD, PLU respectively, there is no probability in which multiple column selecting signals are simultaneously activated, so the bit lines are not subjected to multiple selection.

In some case, the address buffer circuits must be subjected to distributed arrangement due to limitation in layout of the semiconductor storage device. In that case, wires of address signals should be distributed as well. So, lengths of wires from the address buffer circuits and column pre-decoders are not necessarily made identical to each other. Therefore, different loads are applied to the wires respectively.

Thus, even if the address buffer circuits input the address signals at same clock timings, time lags are caused to occur in timing between the column address signals being input to the column pre-decoders. As a result, time lags are correspondingly caused to occur in timing between column selecting signals being output from the column pre-decoders.

If the time lags occur in timing between the column selecting signals, the bit lines are subjected to multiple selection, which causes problems as follows:

A first problem is deterioration of a write recovery characteristic. That is, when the bit lines BL0, BL1 being originally selected are changed with the bit lines BL2, BL3, the column selecting signal YS01 being originally activated is inactivated while the column selecting signal YS02 is activated in FIG. 2.

In the aforementioned condition, if the column selecting signal YS01 makes level transition along the waveform PLD while the column selecting signal YS02 makes level transition along the waveform PFU shown in FIG. 12B, there is provided a duration in which both of the column selecting signals YS01, YS02 are made active at H level. In such a duration, a pair of the column selecting transistors T01, T02 and a pair of the column selecting transistors T11, T12 are simultaneously turned on to establish conduction states. In that case, a data signal output from the sense amplifier SA0 interferes with a data signal output from the sense amplifier SA1, so that data read operations are disturbed. Particularly, in a read operation which is performed in a cycle after a write operation of data, the aforementioned interference between the data signals becomes apparent. This deteriorates the write recovery characteristic.

A second problem is deterioration of operation margins of the data amplifier due to insufficient precharge of the data lines. Normally, precharging of the data lines (DB) is performed to erase a data signal of one memory cell being remained on the data lines when the bit lines (BL) are changed over so that a data signal of another memory cell is output onto the data lines.

At the precharging of the data lines, if the column selecting transistors (e.g., T01, T02) are placed in conduction states so that the corresponding bit lines are connected to the data lines, the sense amplifier (e.g., SA1) having a relatively large drive capability drives the data lines presently being subjected to precharging. For this reason, the precharging is insufficiently performed on the data lines, so the data amplifier is reduced in operation margins.

It may be possible to employ a countermeasure in which the sense amplifier(s) is inactivated during the precharging so that the data lines will not be driven. In such a countermeasure, however, the data lines are connected with loads of the bit lines, so it may take time to perform the precharging on the data lines.

A third problem is dispersion of data read times (or access times). In FIG. 2, the data amplifier 410 is activated at the predetermined timing so as to amplify the data signals appearing on the data lines (DB), which are then forwarded to the following circuitry. The timing to activate the data amplifier 410 is set such that the data amplifier 410 operates when the data signal on the data line is increased to have a prescribed amplitude.

However, if a time lag occurs in timing between the column address signals (YS) as described before, a time lag is correspondingly caused to occur in transmission time between data signals which appear on the data lines from the bit lines (BL). As a result, there is dispersion in amplitude between the data signals on the data lines. This causes dispersion in the data read times.

SUMMARY OF THE INVENTION

It is an object of the invention to provide a semiconductor storage device which is capable of preventing bit lines from being subjected to multiple selection at changeover of bit lines and which is capable of preventing electric characteristics from being deteriorated due to multiple selection of bit lines.

A semiconductor storage device (e.g., synchronous DRAM) is configured using a memory cell array on which memory cells are arranged in a matrix form using word lines and bit lines respectively corresponding to rows and columns, which are designated based on address signals being given from the external. Herein, a row address buffer circuit inputs the address signals in synchronization with an external clock signal to provide a row address signal, which is decoded by a row decoder circuit to selectively activate a corresponding word line. A column address buffer circuit inputs the address signals in synchronization with the external clock signal to provide a column address signal. A column address counter circuit converts the column address signal to internal signals, which designate continuing column addresses of a prescribed burst length. In addition, a column pre-decoder circuit pre-decodes the internal signals in response to a pulse signal so as to produce column address pre-decode signals, which are decoded by a column decoder circuit to produce column selecting signals.

The memory cell array is connected with sense amplifiers and column selecting transistors. Herein, each pair of adjoining bit lines are connected with a single sense amplifier and are further connected to data lines by way of each pair of column selecting transistors, which are controlled in conduction in response to each of the column selecting signals.

Thus, data are to be read from or written to the memory cells by way of the data lines and by selectively turing on the column selecting transistors.

Incidentally, the column pre-decoder circuit retains states of previous internal signals thereof to inactivate the present internal signals during a predetermined duration, which substantially corresponds to a pulse width of the pulse signal. Herein, the pulse signal is created based on a clock synchronization signal and a read-write signal.

Thus, it is possible to avoid occurrence of multiple selection of the bit lines, which are simultaneously selected at a changeover of the bit lines. So, the semiconductor storage device does not deteriorate electric characteristics due to the multiple selection of the bit lines.

BRIEF DESCRIPTION OF THE DRAWINGS

These and other objects, aspects and embodiment of the present invention will be described in more detail with reference to the following drawing figures, of which:

FIG. 7A is a time chart of an external clock signal CLK;

FIG. 7B is a time chart of a row address strobe signal /RAS;

FIG. 7C is a time chart of a column address strobe signal /CAS;

FIG. 7D is a time chart of a write enable signal /WE;

FIG. 7E is a time chart of a chip select signal /CS;

FIG. 7F is a time chart of a command signal CMD;

FIG. 7G is a time chart of an address signal ADi;

FIG. 7H is a time chart of data Di;

FIG. 7I is a time chart of an internal reference clock signal ICLK;

FIG. 7J is a time chart of a buffering signal $\phi_0$;

FIG. 7K is a time chart of a clock synchronization signal $\phi_{CLK}$;

FIG. 7L is a time chart of a buffering clock signal $\phi$;

FIG. 7M is a time chart of a column address signal YA;

FIG. 7N is a time chart of a column address pre-decode signal YP;

FIG. 7O is a time chart of a column selecting signal YS;

FIG. 7P is a time chart of a data clock signal $\phi_1$;

FIG. 7Q is a time chart of a data signal DATA;

FIG. 8A shows waveforms for explaining level transitions of the column address signal YA;

FIG. 8B shows waveforms for explaining level transitions of a column address pre-decode signal YP1;

FIG. 8C shows a pulse of the buffering clock signal $\phi$;

FIG. 9 is a circuit diagram showing a configuration of a gate circuit, which is used for a column pre-decoder circuit in accordance with embodiment 2 of the invention;

FIG. 10A shows a waveform of a buffering clock signal $\phi$ in connection with first situation for explanation of operations of the gate circuit of FIG. 9;

FIG. 10B shows a waveform of a signal S1 in connection with the first situation;

FIG. 10C shows a waveform of a signal S2 in connection with the first situation;

FIG. 10D shows a waveform of a signal S3 in connection with the first situation;

FIG. 10E shows a waveform of the buffering clock signal $\phi$ in connection with second situation for explanation of operations of the gate circuit of FIG. 9;

FIG. 10F shows a waveform of the signal S1 in connection with the second situation;

FIG. 10G shows a waveform of the signal S2 in connection with the second situation;

FIG. 10H shows a waveform of the signal S3 in connection with the second situation;

DESCRIPTION OF THE PREFERRED EMBODIMENTS

Figure 1:
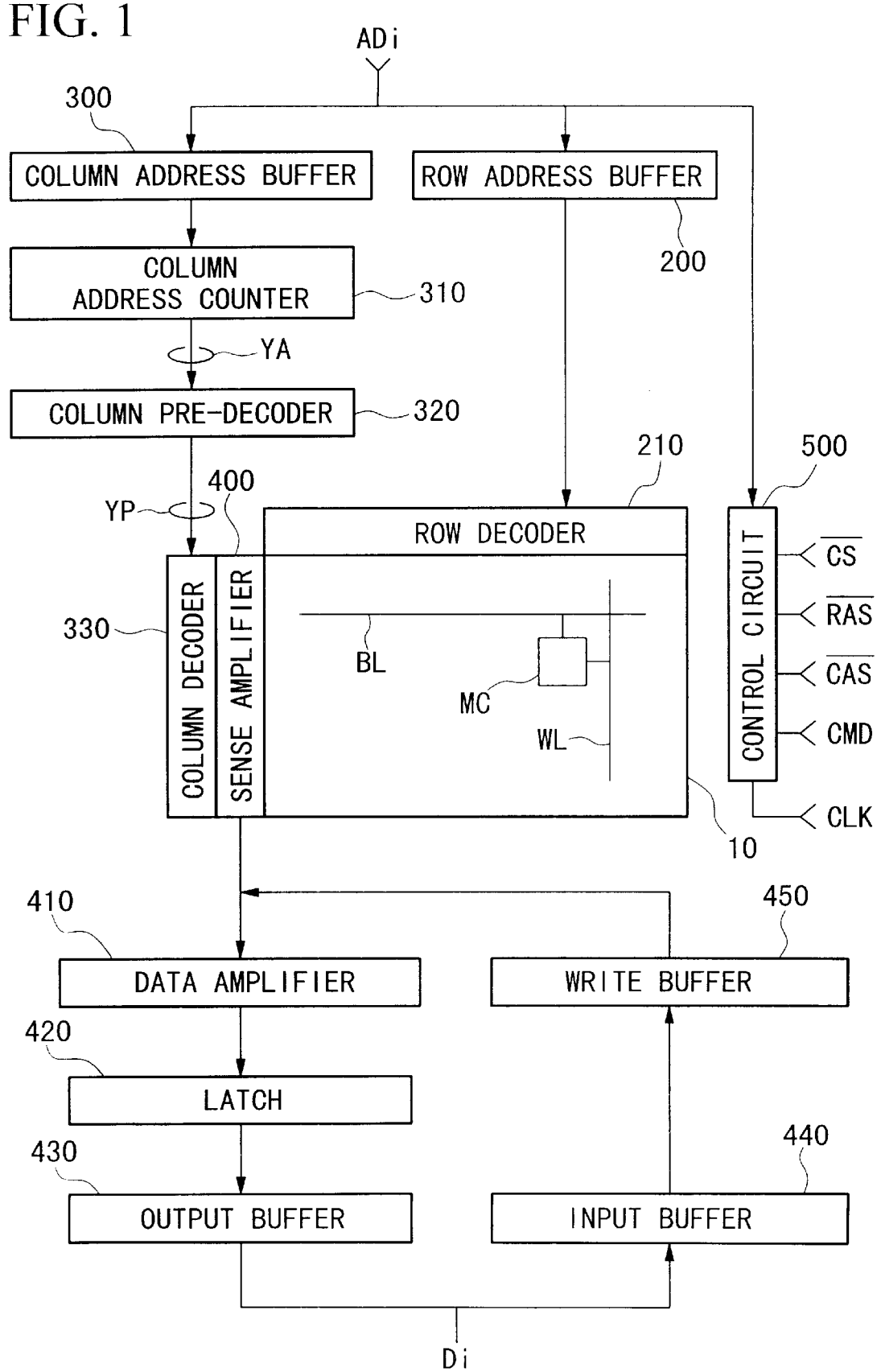
FIG. 1 is a block diagram showing an overall configuration of a semiconductor storage device in accordance with embodiment 1 of the invention.

This invention will be described in further detail by way of examples with reference to the accompanying drawings.

The preferred embodiments each describe a synchronous DRAM as an example of the semiconductor storage device, which will be described in conjunction with the accompanying drawings, wherein common parts are designated by same reference numerals.

[A] Embodiment 1

FIG. 1 shows an outline configuration of the synchronous DRAM in accordance with embodiment 1 of the invention.

In FIG. 1, a memory cell MC stores a single bit, which is a minimum unit of data. The memory cell MC is configured by a capacitor for storing charges corresponding to content of data to be stored and a MOS transistor (where "MOS" is an abbreviation for "Metal-Oxide Semiconductor") for transferring the charges onto a bit line.

Figure 2:
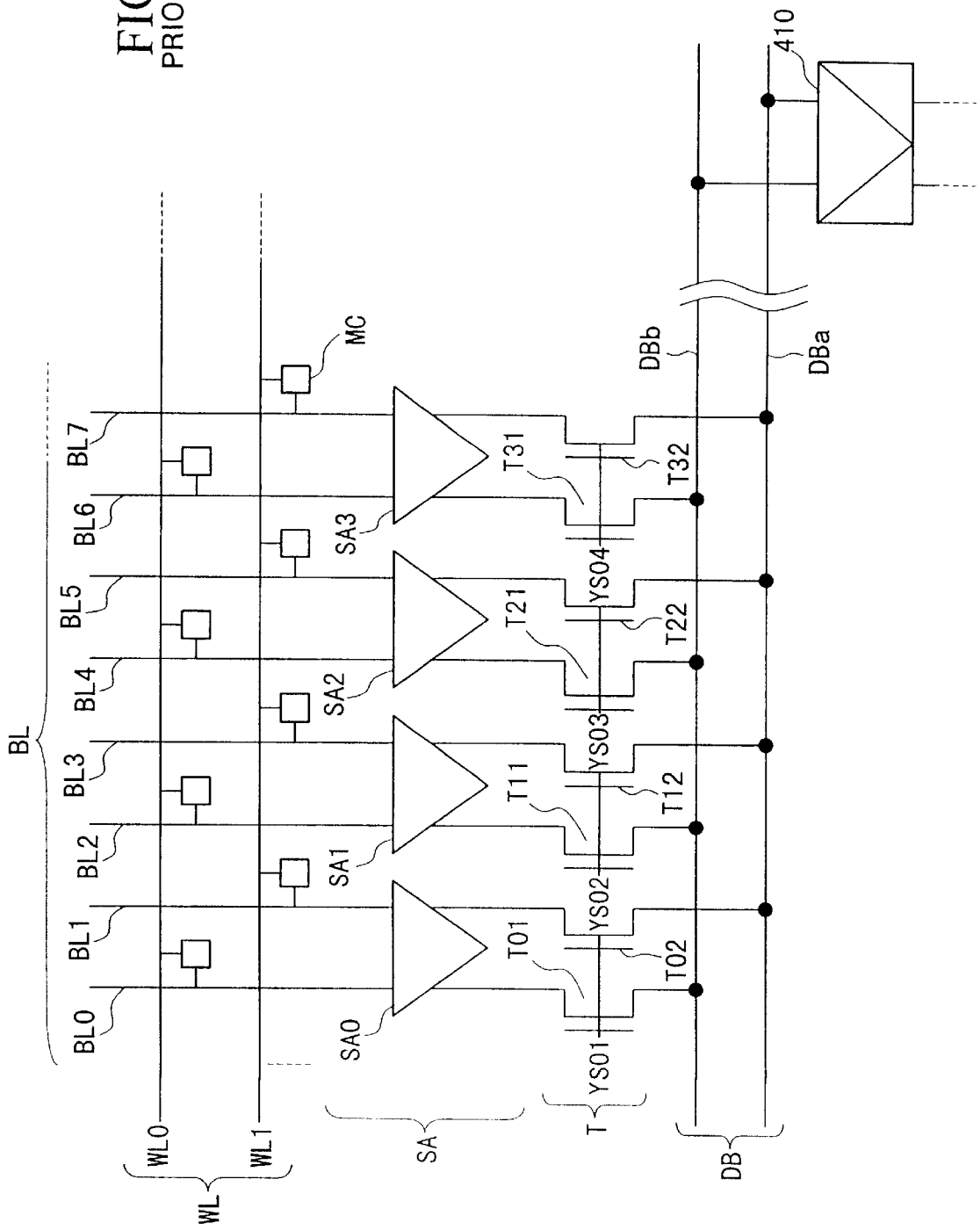
FIG. 2 is a circuit diagram showing a selected part of a memory cell array and its peripheral portions.

A number of memory cells (MC) are arranged in a matrix form to construct a memory cell array 10. In the memory cell array 10, the memory cells arranged in a same column are selected by a word line WL. Each memory cell MC being selected is electrically connected to a bit line BL, by which it is possible to perform operations to write and read data. As shown in FIG. 2, the bit lines (BL) are connected with the data lines (DB; DBa, DBb) by way of the column selecting transistors (T; T01–T32), which are controlled in conduction based on the column address signals being given from the external.

In FIG. 1, a row address buffer circuit 200 inputs a row address signal within address signals ADi given from the external in synchronization with an external clock signal CLK. The row address signal is used to activate the word line WL. The row address buffer circuit 200 converts the row address signal to have a signal level of an internal circuit thereof. Incidentally, there are provided a number of row address buffers, each of which is provided for each of bits of the row address signal.

A row decoder circuit 210 decodes the row address signal, which is input by the row address buffer circuit 200, to selectively activate the word line WL on the memory cell array 10. FIG. 1 does not show specifics, wherein an output signal of the row address buffer circuit 200 is subjected to pre-decoding and is then input to the row decoder circuit 210.

A column address buffer circuit 300 inputs a column address signal within the address signals ADi given from the external in synchronization with the external clock signal CLK. Herein, the column address signal is used to select a bit line. The column address buffer circuit 300 converts the column address signal to have a signal level suited to an internal circuit thereof. A column address counter circuit 310 produces a column address internal signal YA, which is formed being continued in a burst length and a top address of which corresponds to the column address signal being given from the external.

A column pre-decoder circuit 320, which represents a unique technical feature of this invention, pre-decodes the column address signal given from the column address counter circuit 310 to produce a column address pre-decode signal YP. This signal YP is used to select an area whose size is 1/n of a column address area (where "n" is an even number). Details of the column pre-decoder circuit 320 will be described later. A column decoder circuit 330 decodes an output signal of the column pre-decoder circuit 320 to supply a column selecting signal (YS) to a gate of the foregoing column selecting transistor (T), by which the bit line (BL) is to be selected.

A sense amplifier circuit 400 senses and amplifies a data signal of the memory cell MC which appears on the bit line BL. The sense amplifier circuit 400 is configured by multiple sense amplifiers, each of which is of a latch type and which will be described later. The data lines DB are laid in an area of the sense amplifier circuit 400, specifics of which are not illustrated. The data lines DB are electrically connected with the bit lines BL, which are selected by the aforementioned column selecting signal(s) YS.

A data amplifier circuit 410 amplifies data signals, which are output onto the data lines DB from the sense amplifier circuit 400. The data amplifier circuit 410 is configured by a sense amplifier of a current-mirror type, for example. A latch circuit 420 latches and temporarily stores data, which are sequentially output from the data amplifier circuit 410. So, the latch circuit 420 stores data being specified by the "continuing" column address signals, which are produced by the foregoing column address counter circuit 310.

An output buffer circuit 430 drives an external load to send the data latched by the latch circuit 420 to the external (e.g., external device or system, not shown). An input buffer circuit 440 inputs data being given from the external. Specifically, the input buffer circuit 440 converts the data to have signal levels suited to internal circuits of the semiconductor storage device. A write buffer circuit 450 drives the data lines DB to write the data input by the input buffer circuit 440 to the memory cell MC.

A control circuit 500 is provided to control operations of the device as a whole. Specifically, the control circuit 500 inputs a chip select signal CS, a row address strobe signal RAS, a column address strobe signal CAS and a command signal CMD at a leading-edge timing of an external clock signal CLK to set an operation mode, for example. Incidentally, reference symbols CS, RAS and CAS are all written with upper bars (or upper lines) in FIG. 1. For convenience' sake, each of the reference symbols being written with upper bars is accompanied with "/", which is attached prior to each symbol as replacement of the upper bar. For example, the reference symbol RAS with an upper bar is expressed as "/RAS".

FIG. 2 shows a specific circuit configuration with respect to the memory cell array 10, sense amplifier circuit 400 and its peripheral circuit(s). FIG. 2 shows a part of the memory cell array 10 consisting of the memory cells (MC), on which multiple word lines WL are laid in directions of rows while multiple bit lines BL are laid in directions of columns. Herein, the memory cells (MC) are arranged such that each word line WL is connected with one memory cell per two bit lines. That is, arrangement of the memory cells is determined such that the memory cells being connected with the adjoining bit lines BL crossing each word line WL are not activated simultaneously.

In addition, the sense amplifiers (SA0–SA3) are arranged such that a single sense amplifier (SA) is connected with two adjoining bit lines BL. The sense amplifier SA is of a latch type, which is mainly configured by a flip-flop circuit, for example. So, the sense amplifier SA is activated at the predetermined timing to latch and amplify a weak data signal of the memory cell MC which appears on the bit line BL.

The bit lines BL are connected to the data lines DB by way of the column selecting transistors (T01–T32). Herein, each column selecting transistor T is controlled in conduction by the column selecting signal YS (i.e., YS01–YS04). A pair of the bit lines BL connected with the sense amplifier SA are electrically connected to a pair of data lines DBb, DBb respectively. The data lines DB are connected to the data amplifier 410. FIG. 2 does not show the details, in which "total" 512 bit lines are allocated to the device in such a way that connections of the bit lines BL0–BL7 being connected to one data amplifier are repeated.

Next, details of configurations of the column pre-decoder circuit 320 and column decoder circuit 330 shown in FIG. 1 will be described with reference to FIG. 3.

Figure 3:
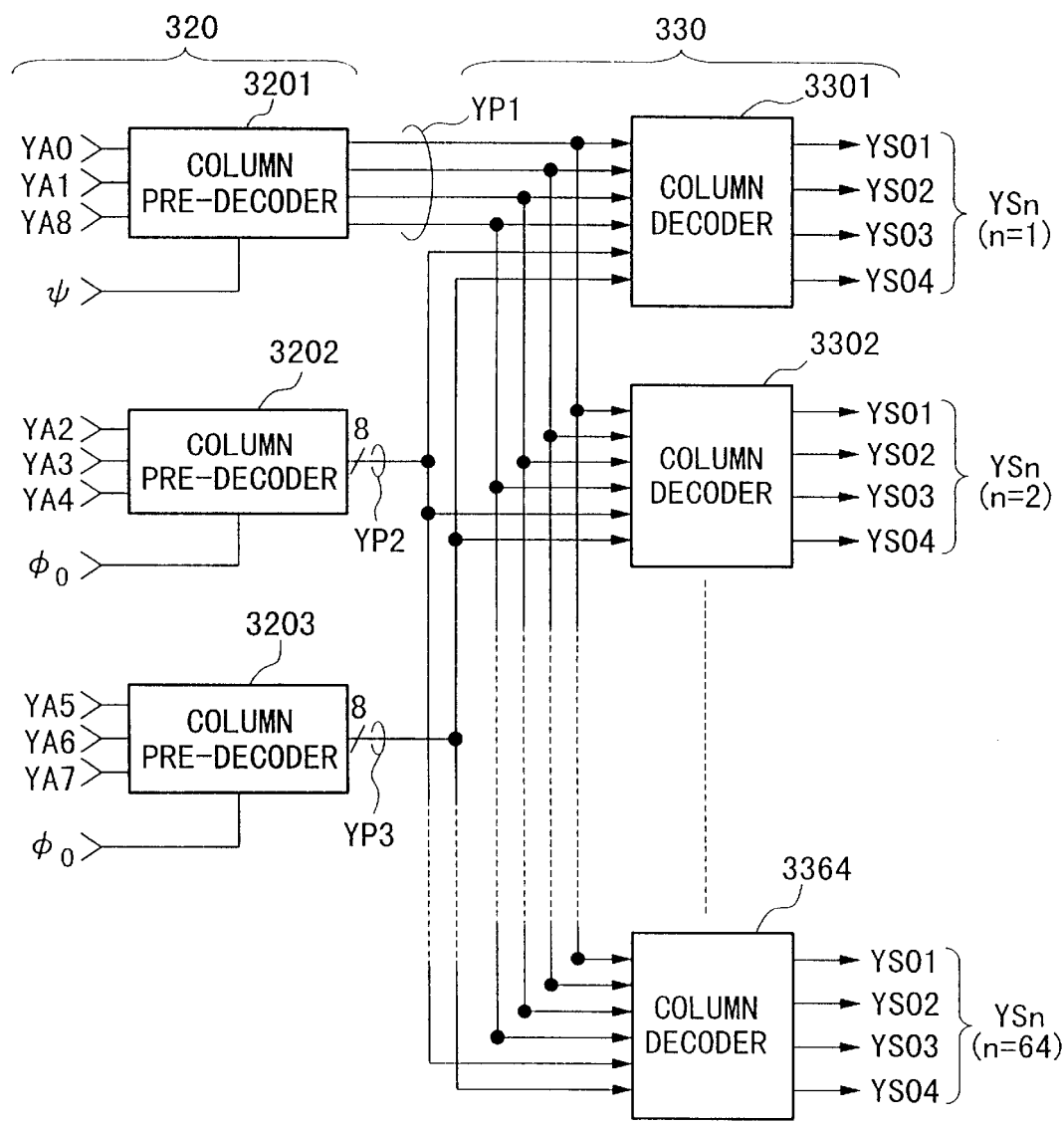
FIG. 3 is a block diagram showing details of a column pre-decoder circuit and a column decoder circuit shown in FIG. 1.

As shown in FIG. 3, the column pre-decoder circuit 320 is configured by three column pre-decoders 3201, 3202 and 3203. Herein, the column pre-decoder 3201 decodes column address signals YA0, YA1 to produce a signal YP1 of four bits, which selects a quarter of a column address area. The column pre-decoder 3202 decodes column address signals YA2–YA4 to produce a signal YP2 of eight bits, which selects one-eighth of the column address area. The column pre-decoder 3203 decodes column address signals YA5–YA7 to produce a signal YP3 of eight bits, which selects one-eighth of the column address area.

The column decoder circuit 330 is configured by sixty four column decoder 3301–3364, which commonly input the four bits of the output signal YP1 of the column pre-decoder 3201. In addition, each of the column decoders 3301–3364 inputs a combination of a single bit of the output signal YP2 of the column pre-decoder 3202 and a single bit of the output signal YP3 of the column pre-decoder 3203.

The column decoder circuit 330 is configured such that when all the bits of the output signal YP1 of the column pre-decoder 3201 are inactivated, all output signals of the column decoders are inactivated. The present embodiment does not show specifics of the semiconductor storage device, wherein there are provided two blocks of the circuitry of FIG. 3. Herein, either one of the blocks is activated in response to a column address signal YA8 input to the column pre-decoder 3201.

Figure 4:
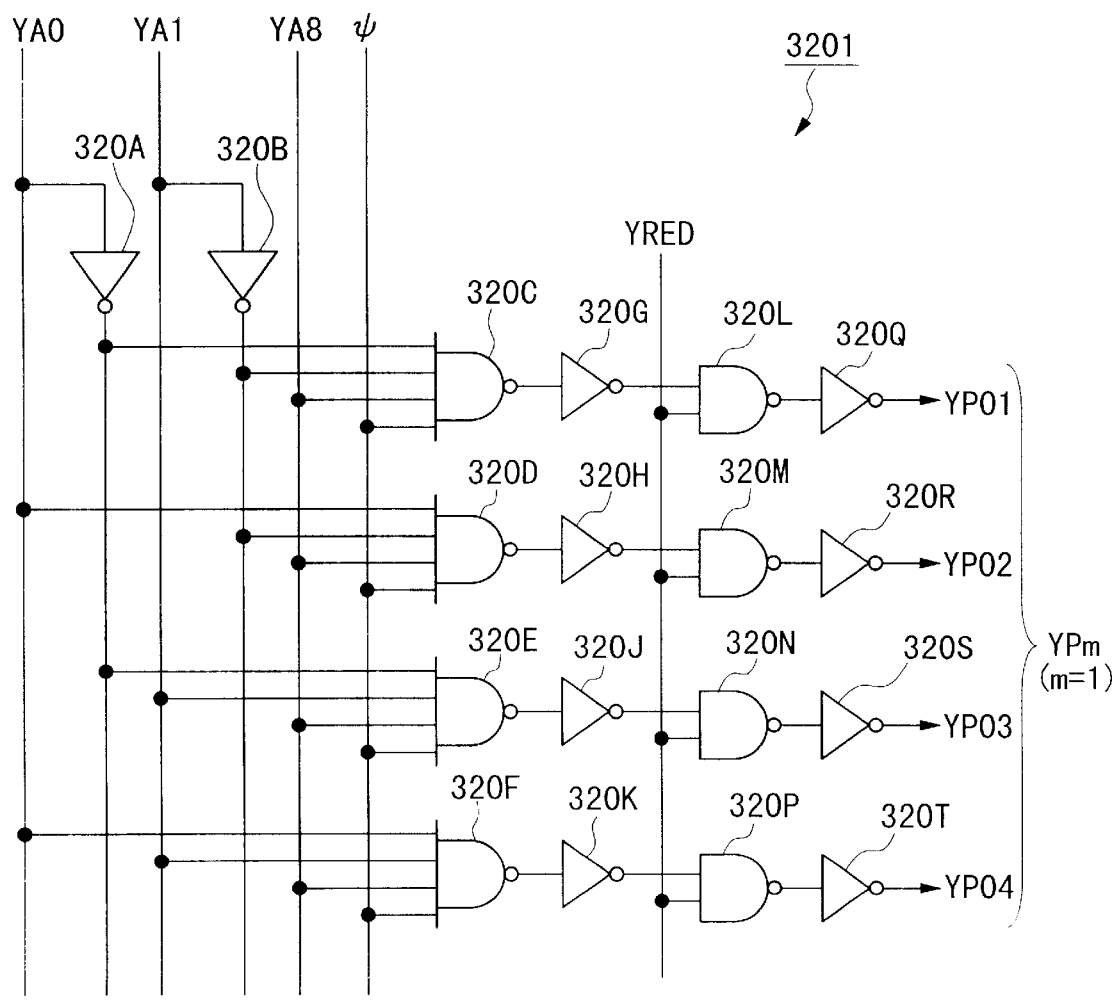
FIG. 4 is a circuit diagram showing details of a column pre-decoder shown in FIG. 3.

FIG. 4 shows a concrete internal configuration of the column pre-decoder 3201, which constructs the column pre-decoder circuit 320.

The column pre-decoder 3201 of FIG. 4 is controlled in activation to operate in response to the column address signal YA8 and a buffering clock signal $\phi$, details of which will be described later. Herein, the column pre-decoder 3201 responds to the column address signals YA0, YA1 being given from the aforementioned column address counter circuit 310 shown in FIG. 1. That is, in response to a combination of a positive-phase signal or negative-phase signal of the column address signal YA0 and a positive-phase signal or negative-phase signal of the column address signal YA1, the column pre-decoder 3201 produces a signal YPm (or YP1, i.e., YP01–YP04), which selects a quarter of the column address area.

In the above, a reference symbol "m" is an index, which designates each of the column pre-decoders 3201–3203. Herein, a reference symbol "YPm" (where m=1, 2, 3) represents the output signal YP1 of the column pre-decoder 3201, the output signal YP2 of the column pre-decoder 3202 or the output signal YP3 of the column pre-decoder 3203.

Next, the configuration of the column pre-decoder 3201 of FIG. 4 will be described in a further concrete manner. The positive-phase signal of the column address signal YA0 is input to NAND gates 320D, 320F respectively, while the negative-phase signal of the column address signal YA0 is input to NAND gates 320C, 320E respectively. In addition, the positive-phase signal of the column address signal YA1 is input to the NAND gates 320E, 320F respectively, while the negative-phase signal of the column address signal YA1 is input to the NAND gates 320C, 320D respectively. Incidentally, the buffering clock signal $\phi$ is commonly input to the NAND gates 320C to 320F.

Outputs of the NAND gates 320C, 320D, 320E and 320F are respectively inverted by inverters 320G, 320H, 320J and 320K, outputs of which are respectively delivered to first inputs of NAND gates 320L, 320M, 320N and 320P. A signal YRED, which is used to select a redundant string (not shown) for fault remedy, is commonly supplied to second inputs of the NAND gates 320L, 320M, 320N and 320P. Outputs of the NAND gates 320L, 320M, 320N and 320P are respectively inverted by inverters 320Q, 320R, 320S and 320T, from which the signal YPm is output. The signal YRED is set at L level to select the redundant string. If the redundant string is not selected, the signal YRED is fixed at H level. So, in order to select the redundant string, all the outputs of the NAND gates 320L, 320M, 320N and 320P are fixed at H levels, so that the signal YPm is fixed at L level (i.e., inactivated state).

The column pre-decoders 3202, 3203 differ from the column pre-decoder 3201 with respect to some design elements such as types of the column address signals and numbers of signals being input. Regardless of such design elements, the column pre-decoders 3202, 3203 are configured similar to the column pre-decoder 3201 shown in FIG. 4. Incidentally, the column pre-decoders 3202, 3203 commonly input a buffering signal $\phi_0$, which replaces the buffering clock signal $\phi$ input to the column pre-decoder 3201. Herein, the buffering signal $\phi_0$ is activated in response to a read-write signal RW, details of which will be described later.

Next, a concrete internal configuration of the column decoder circuit 330 will be described in detail.

As shown in FIG. 3, the column decoder circuit 330 is configured by the column decoders 3301–3364, each of which outputs a column selecting signal YSn (consisting of YS01–YS04) to select a quarter of the column address area in response to the output signal YP1 of the column pre-decoder 3201.

In the above, a reference symbol "n" represents an index, which designates each of the column decoders 3301–3364. In case of n=1, for example, a reference symbol "YSn" designates an output signal of the column decoder 3301. Any one of the sixty-four column decoders 3301–3364 is specified by a combination of a single bit of the 8-bit signal YP2 and a single bit of the 8-bit signal YP3.

Figure 5:
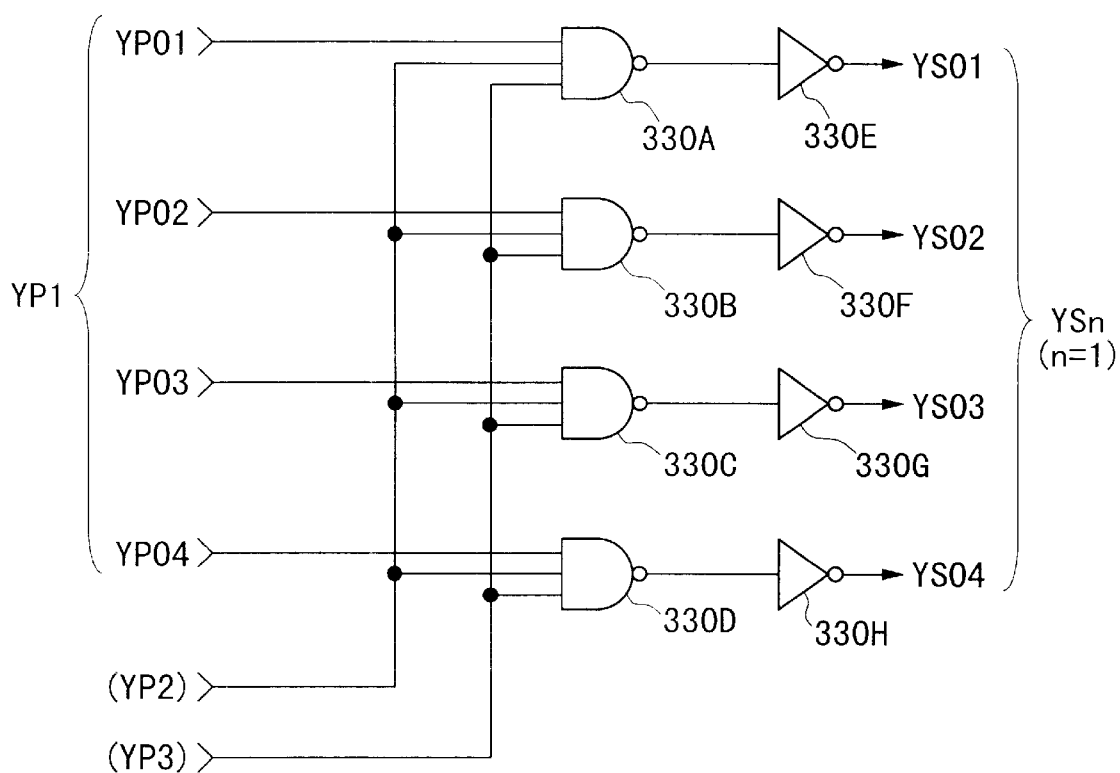
FIG. 5 is a circuit diagram showing details of a column decoder shown in FIG. 3.

FIG. 5 shows an example of a concrete internal configuration of the column decoder 3301.

In the column decoder 3301 of FIG. 5, NAND gates 330A, 330B, 330C and 330D respectively input the aforementioned signals YP01, YP02, YP03 and PY04 output from the column pre-decoder 3201 (see FIG. 4). In addition, the NAND gates 330A–330D commonly input a single bit of the 8-bit signal YP2 output from the column pre-decoder 3202 as well as a single bit of the 8-bit signal YP3 output from the column pre-decoder 3203. Outputs of the NAND gates 330A, 330B, 330C and 330D are respectively inverted by inverters 330E, 330F, 330G and 330H, by which a column selecting signal YSn is output.

The other column decoders 3302 to 3364 differ from the aforementioned column decoder 3301 with respect to some design elements such as combinations of signals being input thereto. Regardless of such design elements, the column decoders 3302 to 3364 are configured similar to the column decoder 3301.

Thus, the column decoder circuit 330 outputs the column selecting signals YSn (where n=1, 2, . . . , 64) each consisting of YS01, YS02, YS03 and YS04. Those signals YS01–YS04 are supplied to the column selecting transistors T01–T32 respectively as shown in FIG. 2. Those transistors are selectively controlled in conduction so that only a pair of the bit lines BL are connected to the data lines DB by way of the transistors which are turned on.

As shown in FIGS. 2, 3, 4 and 5, each of the column decoders 3301–3364 outputs four column selecting signals YS01–YS04, so that 256 column address signals are output in total. Herein, the column address signals YA2–YA7 specify one column decoder within the sixty-four column decoders 3301–3364. In addition, the column address signals YA0, YA1 activate one of the column selecting signals YS01–YS04. Namely, one of the 256 column address signals is selectively activated. Actually, however, there are provided two blocks of the circuitry of FIG. 3, so that 512 column selecting signals are output in total. So, one of the 512 column selecting signals is selectively activated at last. Thus, it is possible to selectively activate 512 bit lines (BL), some of which are shown in FIG. 2.

Figure 6:
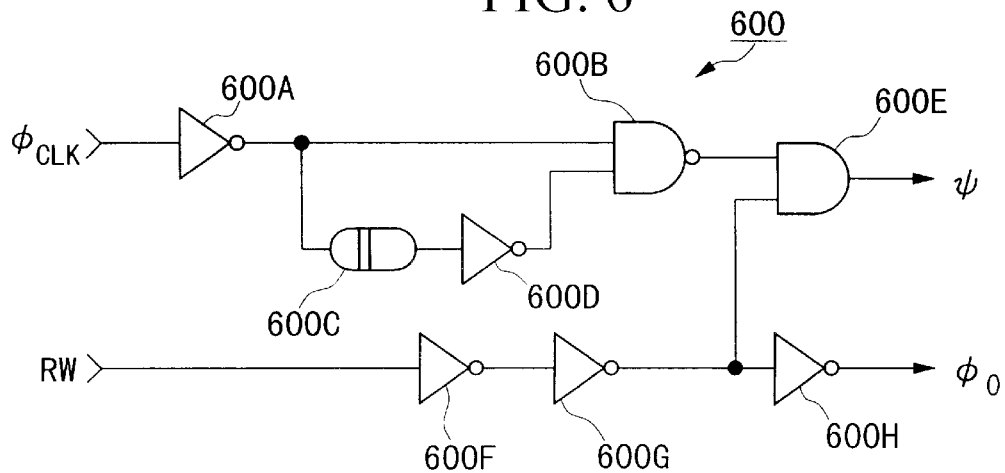
FIG. 6 is a circuit diagram showing a configuration of a signal creation circuit which creates a buffering clock signal and a buffering signal.
Figure 11:
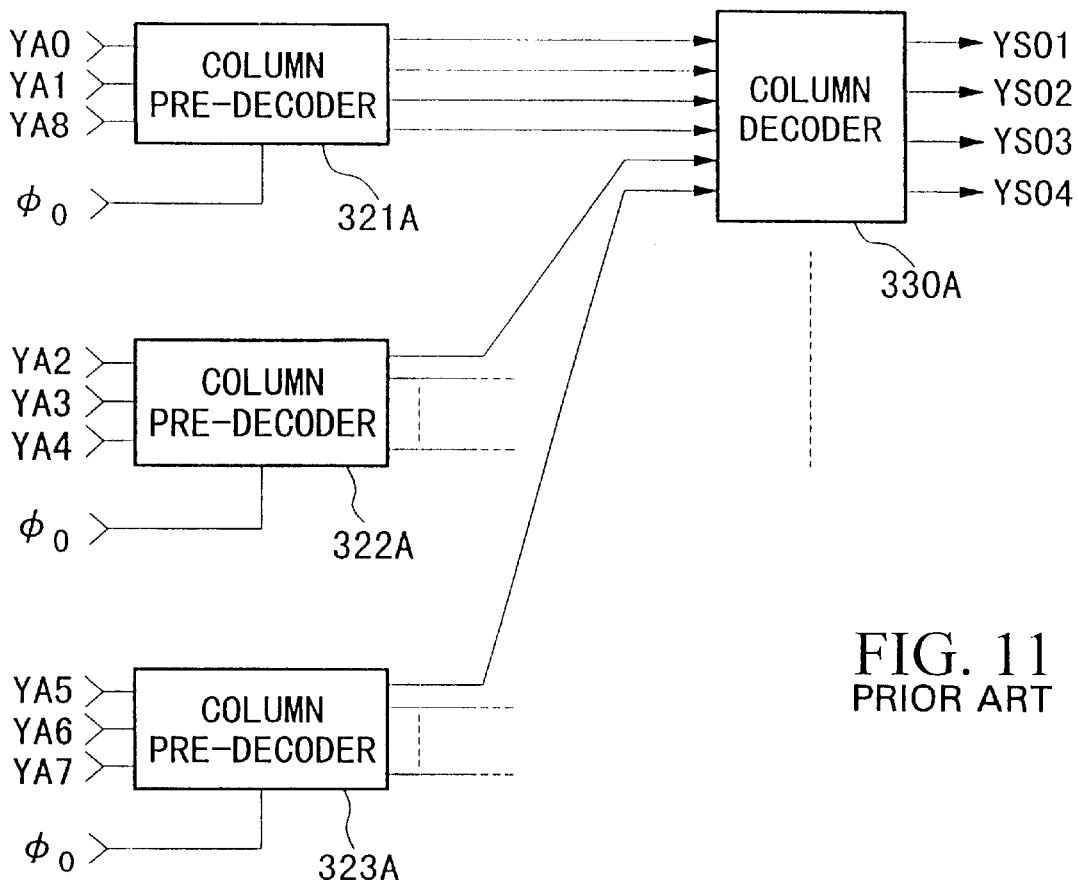
FIG. 11 is a block diagram showing a configuration of a decoder circuit, which is configured by column pre-decoders and a column decoder in the conventional semiconductor storage device.
Figure 12A:
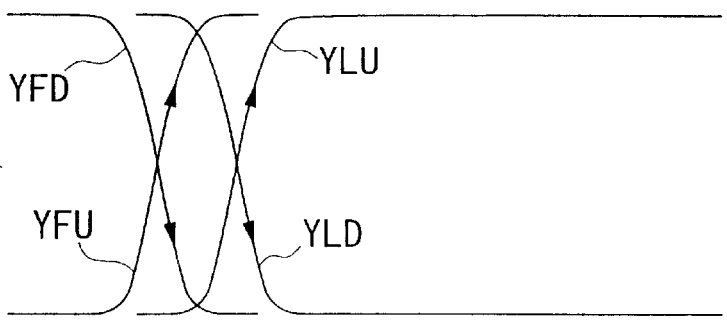
FIG. 12A show waveforms of column address signals being input to the column pre-decoders shown in FIG. 11.
Figure 12B:
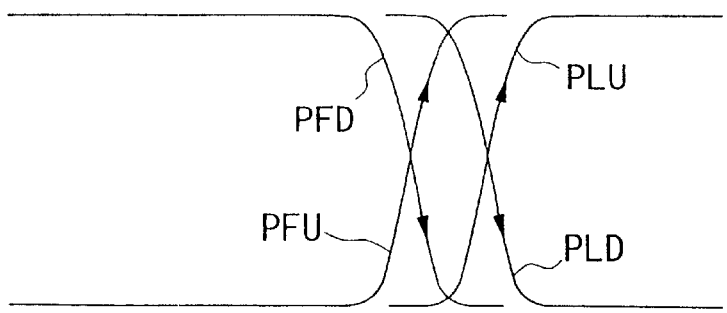
FIG. 12B show waveforms corresponding to outputs of the column pre-decoders.

FIG. 6 shows a signal creation circuit, which creates the foregoing buffering clock signal φ and buffering signal $\phi_0$. This signal creation circuit actualizes a first function to create the buffering clock signal φ by detecting trailing edges of a clock synchronization signal $\phi_{CLK}$ as well as a second function to create the buffering signal $\phi_0$ based on the read-write signal RW. Incidentally, details of the clock synchronization signal $\phi_{CLK}$ and read-write signal RW will be described later.

In FIG. 6, the clock synchronization signal $\phi_{CLK}$ is inverted by an inverter 600A and is then supplied to a first input of a NAND gate 600B. An output of the inverter 600A is delayed by a delay circuit 600C and is then inverted by an inverter 600D, an output of which is supplied to a second input of the NAND gate 600B. An output of the NAND gate 600B is supplied to a first input of a NAND gate 600E, an output of which is used as the buffering clock signal φ.

The read-write signal RW is inverted by inverters 600F, 600G in turn and is then supplied to a buffer 600H, an output of which is used as the buffering signal $\phi_0$. Incidentally, a positive-phase signal of the read-write signal RW, which appears on the output of the inverter 600G, is supplied to a second input of the NAND gate 600E.

In the signal creation circuit of FIG. 6 described above, when the read-write signal RW is at H level, the NAND gate 600E outputs an output signal of the NAND gate 600B as the buffering clock signal φ. When the clock synchronization signal $\phi_{CLK}$ makes level transition from H level to L level, the two inputs of the NAND gate 600B are supplied with signals each having a H level during a delay time of the delay circuit 600C, so an output of the NAND gate 600B corresponds to a L level. In this case, the buffering clock signal φ corresponds to a pulse of L level.

In contrast, when the clock synchronization signal makes level transition from L level to H level, the two inputs of the NAND gate 600B are supplied with signals each having a L level during the delay time of the delay circuit 600C, so an output of the NAND gate 600B remains at H level. Therefore, the buffering clock signal φ remains at H level as well.

As described above, the signal creation circuit of FIG. 6 operates in such a way that a pulse of L level is created at a trailing edge of the clock synchronization signal $\phi_{CLK}$ as the buffering clock signal φ.

Next, operations of the semiconductor storage device of the embodiment 1 will be described with reference to time charts of FIGS. 7A to 7Q.

FIGS. 7A to 7H show signals (and data) CLK, /RAS, /CAS, /WE, /CS, CMD, ADi and Di, all of which are given from the external. In addition, FIGS. 7I to 7Q show signals (and data) ICLK, $\phi_0$, $\phi_{CLK}$, φ, YA, YP, YS, $\phi_1$ and DATA, all of which are produced inside of the semiconductor storage device.

An external clock signal CLK of FIG. 7A sets basis for the operation timing of the device. A row address strobe signal /RAS of FIG. 7B is a control signal by which the address signal being given from the external is input to the device as the row address signal. A column address strobe signal /CAS of FIG. 7C is a control signal by which the address signal given from the external is input to the device as the column address signal.

A write enable signal /WE of FIG. 7D is a control signal which controls a write operation or a read operation. A chip select signal /CS of FIG. 7E is a control signal which controls activation states of the device as a whole. A command signal CMD of FIG. 7F is a control signal which controls an operation mode of the device. An address signal ADi of FIG. 7G is a signal which designates destination of storage (i.e., address) of data. In addition, data Di of FIG. 7H correspond to an information signal which represents information of a storing subject.

An internal reference clock signal ICLK of FIG. 7I is a clock signal, which derives from the external clock signal CLK. The buffering signal $\phi_0$ of FIG. 7J is an internal signal, which is activated by the read-write signal RW after input of column address strobe. The read-write signal RW is an internal signal, which is activated by a read command (RED) or a write command (WRT). Incidentally, a waveform of the read-write signal RW is expressed using a waveform of the buffering signal $\phi_0$ of FIG. 7J.

The clock synchronization signal $\phi_{CLK}$ of FIG. 7K is a clock signal which derives from the internal reference clock signal ICLK of FIG. 7I. The clock synchronization signal $\phi_{CLK}$ incorporates pulses of the internal reference clock signal ICLK and inverse logic (i.e., L pulses), wherein it is activated when the buffering signal $\phi_0$ is activated. The buffering clock signal φ of FIG. 7L consists of pulses, each of which is produced by detection of a trailing edge of the clock synchronization signal $\phi_{CLK}$. The buffering clock signal φ is activated when the buffering signal $\phi_0$ is activated.

The column address signal YA of FIG. 7M is an internal signal, which the device produces by inputting the address signal ADi given from the external. The column address pre-decode signal YP of FIG. 7N is an internal signal, which the device produces by decoding the column address signal YA. The column selecting signal YS is an internal signal, which the device produces by decoding the column address pre-decode signal YP. A data clock signal $\phi_1$ of FIG. 7P is an internal signal, which is used to initialize the data lines and data amplifier(s). Herein, the data clock signal $\phi_1$ derives from the clock synchronization signal $\phi_{CLK}$. Data (or data signals) DATA are information signals, which appear on the data lines DB.

Next, concrete operations of the semiconductor storage device will be described by way of an example in which a burst length is set at "4", and a read operation is made after a write operation.

First, the row address strobe signal /RAS, chip select signal /CS, command signal CMD (ACT; or activation) and address signal ADi are set up for the device, so that the device inputs those signals at a leading edge e1 of a pulse of the external clock signal CLK shown in FIG. 7A. At this time, the row address buffer circuit 200 inputs the address signal ADi (X) as a row address signal in synchronization with the external clock signal CLK. Then, the row decoder circuit 210 decodes the row address signal being input by the row address buffer circuit 200 so as to activate a word line WL on the memory cell array 10.

Next, the column address strobe signal /CAS, write enable signal /WE, chip select signal /CS, command signal CMD (WRT; write command), address signal ADi (Y) and data Di (D1) are set up for the device, so that the device inputs those signals at a leading edge e3 of the external clock signal CLK. At this time, the column address buffer circuit 300 inputs the address signal ADi as a column address signal in synchronization with the external clock signal CLK.

A column address (Y) being input by the column address buffer circuit 300 is used as a top address. So, the column address counter circuit 310 uses such a top address Y to sequentially output a series of column addresses "YA", i.e., Y, Y+1, Y+2, Y+3 in turn. The column pre-decoder circuit 320 receives the column addresses YA (Y, Y+1, Y+2, Y+3) so as to sequentially produce column address pre-decode signals YP (Y, Y+1, Y+2, Y+3).

Under control of the control circuit 500 which inputs the column address strobe signal /CAS, the signal creation circuit of FIG. 6 activates the buffering signal $\phi_0$, which is supplied to the column pre-decoders 3202, 3203 of the column pre-decoder circuit 320 respectively. In addition, the signal creation circuit detects trailing edges of pulses of the clock synchronization signal $\phi_{CLK}$, so that the buffering clock signal $\phi$ is supplied to the column pre-decoder 3201 of the column pre-decoder circuit 320.

Next, a description will be given in detail with respect to operations to control the column pre-decoder circuit 320 based on the buffering clock signal $\phi$ with reference to FIGS. 8A, 8B and 8C.

Suppose that dispersion exists between transmission speeds of the column address signals YA (i.e., YA0–YA8) being input to the column pre-decoder circuit 320, so that time lags are caused to occur in timing between the column address signals YA. In that case, there occurs a duration in which multiple column address signals are transiently and simultaneously at H level. In case of FIG. 8A, both of two waveforms b, c are transiently at H level, for example.

In the column pre-decoder circuit 320 shown in FIG. 4, all of the NAND gates 320C, 320D, 320E and 320F input the buffering clock signal $\phi$ from the foregoing signal creation circuit. So, when the buffering clock signal $\phi$ is at L level, all outputs of the NAND gates 320C–320F are fixed at H level. Thus, the column address pre-decode signals YP (i.e., YP01–YP04) shown in FIG. 8B are fixed in inactivation states (i.e., L level) during a predetermined duration, which is controlled by a pulse width of the buffering clock signal $\phi$ shown in FIG. 8C.

In case of FIG. 8B, for example, waveforms a, b originally shown in FIG. 8A are moved to match with a waveform e which responds to a trailing edge of the buffering clock signal $\phi$ of FIG. 8C, while a waveform c originally shown in FIG. 8A is moved to match with a waveform f which responds to a leading edge of the buffering clock signal $\phi$. Thus, the column address pre-decode signal YP1 is fixed in an inactivation state during the predetermined duration.

The column pre-decoder circuit 320 outputs the column address pre-decode signal YP, which is supplied to the column decoder circuit 330. Upon receipt of the column address pre-decode signal YP, the column decoder circuit 330 outputs the column selecting signal YS (i.e., YS01–YS04), which controls the column selecting transistors T in conduction.

As described above, while the column address signal YA changes in an order of Y→Y+1→Y+2→Y+3 in turn, multiple signals (YP01–YP04) of the column address pre-decode signal YP1 are not activated simultaneously, so multiple signals (YS01–YS04) of the column selecting signal YS are not activated simultaneously. Therefore, multiple pairs of the column selecting transistors (T) are not placed in conduction states simultaneously. In other words, the bit lines are not subjected to multiple selection. Thus, only the bit lines which are specified by the column address signal are selectively connected to the data lines DB by way of a pair of the column selecting transistors which are turned on.

The semiconductor storage device of the present embodiment performs an operation to input data Di given from the external in parallel with the aforementioned selecting operation of the bit lines. That is, the input buffer circuit 440 sequentially inputs D1–D4 of the data Di during four clock cycles. The write buffer circuit 450 sequentially sends out the data D1–D4 of the data Di, which are input by the input buffer circuit 440, onto the data lines DB. Those data are written into the memory cells by way of the bit lines, which are selected as described before. Thus, the write operation is completed.

Next, a description will be given with respect to the read operation, which is performed by the semiconductor storage device after completion of the write operation.

In order to perform the read operation, the column address strobe signal /CAS, command signal CMD (RED; read command) and address signal ADi (Y) are set up for the device, so that the device inputs those signals at a leading edge e7 of the external clock signal CLK shown in FIG. 7A. At this time, the column address buffer circuit 300 inputs the address signal ADi as a column address signal in synchronization with the external clock signal CLK. Herein, a column address (Y) being input by the column address buffer circuit 300 is used as a top address. So, the column address counter circuit 310 uses such a top address Y to sequentially output column addresses "YA", i.e., Y, Y+1, Y+2, Y+3 in turn.

Upon receipt of the column addresses YA, the column pre-decoder circuit 320 outputs a column address pre-decode signal YP, which designates the column addresses Y, Y+1, Y+2 and Y+3. Upon receipt of the column address pre-decode signal YP, the column decoder circuit 330 controls the column selecting transistors (T) in conduction so as to select bit lines. Then, data signals of the memory cells connected with the selected bit lines are transmitted to the data lines DB and are then amplified by the data amplifier 410. Thereafter, they are output to the external by way of the latch circuit 420 and the output buffer circuit 430.

At a mode of the read operation, the column pre-decoder circuit 320 similarly performs the foregoing operations being performed at a mode of the write operation. So, while the column address signal YA changes in an order of Y→Y+1→Y+2→Y+3 in turn, multiple signals (YP01–YP04) of the column address pre-decode signal YP1 are not activated simultaneously. Therefore, multiple signals (YS01–YS04) of the column selecting signal YS are not activated simultaneously, so the bit lines are not subjected to multiple selection.

[B] Embodiment 2

Next, a description will be given with respect to a semiconductor storage device in accordance with embodiment 2 of the invention.

In the aforementioned semiconductor storage device of the embodiment 1, the inactivation duration of the column address pre-decode signal YP1 is controlled by the pulse width of the buffering clock signal $\phi$. As compared with the embodiment 1, the embodiment 2 is modified such that a start point of the inactivation duration of the column address pre-decode signal YP1 is controlled by the buffering clock signal $\phi$, while an end point of the inactivation duration of the column address pre-decode signal YP1 is controlled in response to the column address signal YA. Thus, it is possible to avoid occurrence of a delay in selecting the bit lines due to inactivation of the column address pre-decode signal YP1 by the buffering clock signal $\phi$.

The semiconductor storage device of the embodiment 2 is basically similar to the aforementioned embodiment 1. In the embodiment 1, the column pre-decoder (3201) of FIG. 4 is configured using AND gates, which are configured by the NAND gates 320C, 320D, 320E and 320F and the inverters 320G, 320H, 320J and 320K. Different from the embodiment 1, the embodiment 2 is characterized by that the column pre-decoder is configured using a gate circuit of FIG. 9 instead of the aforementioned AND gates.

In FIG. 9, a NAND gate 800 corresponds to the foregoing NAND gates 320C–320F shown in FIG. 4. Herein, the NAND gate 800 inputs a signal S1, which corresponds to the foregoing column address signals YA0, YA1 and YA8. In addition, the NAND gate 800 also inputs the buffering clock signal φ by way of a transistor 805, details of which will be described later. An inverter 802 corresponds to the foregoing inverters 320G–320K. The inverter 802 inverts an output of the NAND gate 800 to output a signal S3. The NAND gate 800 and the inverter 802 are coupled together to form an AND gate.

A latch circuit 803 latches the output signal S3 of the inverter 802 based on the buffering clock signal φ. That is, when the buffering clock signal φ is at H level, the latch circuit 803 passes the signal S3 therethrough as a signal S2. In contrast, when the buffering clock signal φ is at L level, the latch circuit 803 outputs the signal S2 corresponding to the signal S3 being latched therein.

The transistor 805 transfers the buffering clock signal φ to the NAND gate 800. A MOS FET (i.e., Metal-Oxide Semiconductor Field-Effect Transistor) of N type is used for the transistor 805. One end of a current path (i.e., source) of the transistor 805 is connected to a wire of the buffering clock signal φ. Another end of the current path (i.e., drain) of the transistor 805 is connected to an input of the NAND gate 800. In addition, a gate of the transistor 805 is connected to an output terminal of the latch circuit 803. Further, a resistor 806 which acts as a load circuit is connected between the input of the NAND gate 800 connected with the drain of the transistor 805 and power source for supplying predetermined source voltage.

Next, a description will be given with respect to operations of the gate circuit of FIG. 9.

In the gate circuit, a state (or level) of the signal S3 being output in response to the signal S1 is input and latched in the latch circuit 803 on the basis of the buffering clock signal φ, so that conduction of the transistor 805 is controlled based on the signal level latched in the latch circuit 803. Thus, it is possible to control an operation for inputting the buffering clock signal φ to the NAND gate 800. In addition, it is possible to control activation state of the signal S3 in response to a previous state of the signal S3.

Next, the operations of the gate circuit of FIG. 9 will be described in further detail with reference to FIGS. 10A to 10H.

First, the operations will be described with regard to first situation in conjunction with FIGS. 10A to 10D, wherein an initial condition is defined such that the buffering clock signal φ (see FIG. 10A) is at H level while the signal S3 (see FIG. 10D) is at H level based on the signal S1 (see FIG. 10B).

In the above state, the latch circuit 803 is placed in a "through" state, so that the signal level (i.e., H level) of the signal S3 is directly applied to the gate of the transistor 805 as the signal S2. Thus, the transistor 805 is placed in a conduction state, so that the buffering clock signal φ is supplied to the input of the NAND gate 800 by way of the transistor 805. In that condition, when the buffering clock signal φ makes level transition from H level to L level as shown in FIG. 10A, the L level is applied to the input of the NAND gate 800 by way of the transistor 805 which is turned on. At this time, the latch circuit 803 is placed in a latch state, so that it latches a previous signal level (i.e., H level) of the signal S3. So, the signal S2 is retained at H level, which is shown in FIG. 10C.

In addition, an output of the NAND gate 800 is set at H level because it inputs the buffering clock signal φ having the L level. Therefore, the signal S3 is changed as shown in FIG. 10D to have an L level, regardless of states of the signal S1. In other words, the signal S3 is inactivated at a trailing edge of the buffering clock signal φ. Thereafter, even when the signal S1 is changed in response to a change of the column address signal, the signal S3 is not activated anymore on the basis of the signal S1.

Thereafter, when the buffering clock signal φ is restored to have a H level, the latch circuit 803 is placed in the through state, so that the signal level (i.e., L level) of the signal S3 appears as the signal S2. This turns the transistor 805 to be in a non-conduction state. Thus, a source level (i.e., H level) of the power source is applied, by way of the resistor 806, to the input of the NAND gate 800, to which the buffering clock signal φ has been applied previously. In this case, however, the signal S3 is not activated anymore based on the signal S1. So, even when the buffering clock signal φ is restored to have the H level, the signal S3 is retained in the inactivation state (i.e., L level).

As described above, the gate circuit of FIG. 9 operates as similar to the column pre-decoder circuit 320 wherein the signal S3 corresponds to the column address pre-decode signal YP as well as output signals of the inverters 320G–320K. That is, the signal S3 which is originally activated in the initial condition is inactivated by a trailing edge of the buffering clock signal φ, so that the foregoing column address pre-decode signals YP01–YP04 are inactivated as well.

Next, operations of the gate circuit will be described with regard to second situation in conjunction with FIGS. 10E to 10H, wherein an initial condition is defined such that the buffering clock signal φ (see FIG. 10E) is at H level while the signal S3 (see FIG. 10H) is at L level (i.e., inactivation state) based on the signal S1 (see FIG. 10F). In such an initial condition, the latch circuit 803 is placed in a through state, so that a signal level (i.e., L level) of the signal S3 is applied to the gate of the transistor 805 as the signal S2 (see FIG. 10G).

Thus, the transistor is placed in a non-conduction state, so that the source level (i.e., H level) of the power source is applied, by way of the resistor 806, to the input of the NAND gate 800, to which the buffering clock signal φ is to be applied. As described above, in the initial condition, the buffering clock signal φ is not applied to the input of the NAND gate 800, therefore, an output level of the NAND gate 800 is determined directly based on only the signal S1.

After the initial condition, when the buffering clock signal φ makes level transition from H level to L level, the latch circuit 803 is placed in a latch state, so that it latches a previous state (i.e., L level) of the signal S3. Therefore, the signal S2 is retained at L level. Thus, the transistor 805 is retained in the non-conduction state, so the NAND gate 800 is still maintained in a condition where its output is directly determined based on only the signal S1.

When the signal S1 changes in level in response to a change of the column address signal, the signal S3 is correspondingly activated so that it makes level transition from L level to H level on the basis of the signal S1. Thereafter, when the buffering clock signal φ is restored to have a H level, the latch circuit 803 is placed in the through state, so that a signal level (i.e., H level) of the signal S3 appears on the signal S2, which is shown in FIG. 10G. Thus, the transistor 805 is placed in a conduction state, so that the buffering clock signal φ is applied to the input of the NAND gate 800 by way of the transistor 805 which is turned on.

As described above, the gate circuit of FIG. 9 employed in the embodiment 2 differs from the column pre-decoder circuit 320 of the foregoing embodiment 2 with respect to operations, which are performed after the initial condition where the signal S3 corresponding to the column address pre-decode signal YP is inactivated. That is, the signal S3 corresponding to the column address pre-decode signal YP is activated without being controlled by the buffering clock signal φ at all. So, it is possible to promptly activate the column address pre-decode signals YP01–YP04.

Incidentally, the initial condition of the first situation shown in FIGS. 10A to 10D may match with a final condition of the second situation shown in FIGS. 10E to 10H. In addition, the initial condition of the second situation may match with a final condition of the first situation.

As described above, unless the same address is continuously designated, the gate circuit of the embodiment 2 shown in FIG. 9 operates such that the signal S3, which is previously activated, is forced to be inactivated by the buffering clock signal φ. In addition, the gate circuit operates such that the signal S3, which is previously inactivated, is activated based on the signal S1, regardless of the buffering clock signal φ.

Therefore, activation of the signal S3 is not restricted by the buffering clock signal φ, so it is possible to promptly perform selection of the bit lines. Thus, in a burst mode of the synchronous DRAM where a burst length is two or more so that the same column address is not designated continuously, it is possible to read data signals of the memory cells at high speed.

As described heretofore, this invention is described by way of the embodiments 1 and 2. However, this invention is not limited by those embodiments. Hence, it is possible to embrace modifications of designs of the devices, which do not depart from the scope of the invention.

For example, the foregoing embodiments describe such that the column pre-decoder circuit 320 is controlled by the buffering clock signal φ. However, it is possible to modify the embodiments such that other column-related circuitry such as the column decoder circuit 330 is controlled by the buffering clock signal φ. In addition, the embodiments describe about the synchronous DRAM to which this invention is applied. Of course, this invention is not necessarily applied to the synchronous DRAM. Hence, this invention is applicable to any types of the semiconductor storage devices.

The embodiment 2 describes such that in the column pre-decoder circuit 320, the signal state is latched to restrict the control subject being controlled by the buffering clock signal φ. It is possible to modify the embodiment 2 such that the signal state is latched in the column decoder circuit 330.

In addition, the embodiment 2 directly uses the buffering clock signal φ to control the latch circuit 803. However, it is possible to use another signal, which differs from the buffering clock signal φ, by which the latch circuit 803 is to be controlled.

Moreover, the embodiment 2 describes such that the signal S3, which is previously activated, is controlled to be inactivated by the buffering clock signal φ. The embodiment 2 can be modified to control the signal to be activated after a change of the column address. In this case, activation of the signal S3 is not controlled by the buffering clock signal φ any more, hence, it is possible to set the same timing for activation.

As described heretofore, this invention has a variety of technical features and effects, which are summarized as follows:

(1) In a first aspect of this invention, the semiconductor storage device is basically configured by a memory cell array (10) on which memory cells (MC) are arranged in a matrix form using word lines (WL) and bit lines (BL) corresponding to rows and columns respectively, wherein in synchronization with an external clock signal (CLK) being given from the external, the device inputs a row address signal and a column address signal designating a row address and a column address for specifying a memory cell, from which data are read or to which data are written. In addition, column selecting transistors (T) are connected between the bit lines and data lines (DB). Further, a column selection circuit (320, 330) controls the column selecting transistors to be placed in non-conduction states during a predetermined duration, which corresponds to a pulse width of a buffering clock signal (φ), when the device inputs the column address signal.

(2) According to the first aspect of this invention, when the semiconductor storage device inputs the column address signal from the external, the column selecting transistors are controlled to be placed in non-conduction states during the predetermined duration, regardless of the column address signal. Therefore, even if differences lie in propagation speeds of column address signals inside of the semiconductor storage device, multiple signals for activating the column selecting transistors are not simultaneously activated. This avoids an event in which the column selecting transistors are changed over in conduction in synchronization with the column address signals being given from the external. So, all the bit lines are electrically disconnected from the data lines during the predetermined duration. Thus, the bit lines are not subjected to multiple selection at a changeover of the column address signals.

(3) In a second aspect of this invention, the column selection circuit is configured by a pulse creation circuit (corresponding to creation of the buffering clock signal φ in the foregoing signal creation circuit of FIG. 6), column address buffers (e.g., column address buffer circuit 300 and column address counter circuit 310), a column pre-decoder circuit (e.g., 320) and a column decoder circuit (e.g., column decoder circuit 330 and column selecting transistors T). Herein, the pulse creation circuit creates a pulse signal (e.g., buffering clock signal φ) consisting of pulses each having a predetermined pulse width by detecting edges of pulses of the external clock signal. The column address buffers input the column address signals from the external in synchronization with the external clock signal so as to convert them to internal signals each having a predetermined logic level. The column pre-decoder circuit inputs combinations of the internal signals of the column address buffers so as to output signals (e.g., column address pre-decode signals YPm), at least one of which is selectively activated. The column decoder circuit controls the column selecting transistors to be selectively placed in conduction states in response to the signals of the column pre-decoder circuit. In addition, the column pre-decoder circuit fixes the signals thereof to be in inactivation states during the predetermined duration in response to the pulse signal.

(4) According to the second aspect of this invention, after the device inputs the column address signal from the external in synchronization with the external clock signal, the column pre-decoder circuit decodes the column address signal to control the column selecting transistors in conduction. At this time, the column pre-decoder circuit places the output signal(s) thereof in inactivation states during the predetermined duration based on the pulse signal, by which the column selecting transistors are controlled to be in non-conduction states. Therefore, all the bit lines are electrically disconnected from the data lines during the predetermined duration, which is specified by the pulse width of the pulse signal. In addition, the output signal(s) of the column pre-decoder circuit is activated in synchronization with the external clock signal. Herein, a time for activation of the column pre-decoder circuit is determined by the pulse signal. Thus, no dispersion occurs on times for selecting the bit lines.

(5) In a third aspect of this invention, the semiconductor storage device is designed such that when the column address buffer inputs the column address signal from the external, the column pre-decoder circuit retains states of the signals, which are previously output therefrom, so a signal having a specific state within the signals is selectively fixed in an inactivation state during the predetermined duration on the basis of the retained states of the signals and the pulse signal. According to the third aspect of this invention, after the device inputs the column address signal from the external in synchronization with the external clock signal, the column pre-decoder circuit decodes the column address signal to control the column selecting transistors in conduction. At this time, the column pre-decoder circuit selectively inactivates the output signal(s) thereof during the predetermined duration based on the pulse signal and states of signals which are previously output therefrom, so that the column selecting transistors are controlled to be in non-conduction states.

(6) In inactivation of the signals which are previously output from the column pre-decoder circuit, the column pre-decoder circuit fixes only the signal, which is previously activated, in an inactivation state based on the pulse signal. So, other signals are not controlled by the pulse signal. Thus, specific bit lines, which are previously selected, are electrically disconnected from the data lines during the predetermined duration, which is specified by the pulse width of the pulse signal. So, other bit lines will be sequentially selected in accordance with activation of column selecting signals (YS).

(7) For example, a front edge of the pulse signal is set prior to the column selecting signal which is activated at first, while a back edge of the pulse signal is set being delayed from the column selecting signal which is inactivated at last. Thus, all the column selecting signals are placed in inactivation states during a period of time between the front edge of the pulse signal and the column selecting signal which is activated at first. Due to non-conduction states of the column selecting transistors being controlled, a delay is caused to occur in transmission of data being transmitted onto the data lines from the bit lines. According to this invention, it is possible to avoid occurrence of such a delay in transmission of the data signals. Thus, it is possible to prevent the bit lines from being subjected to multiple selection.

(8) According to a fourth aspect of this invention, the column pre-decoder circuit has multiple gate circuits (as shown in FIG. 9), which input the pulse signal as well as the signals from the column address buffers. Herein, each of the gate circuits is configured by a latch circuit (803), a transistor (805) and a load circuit (806). The latch circuit latches an output of the gate circuit based on the pulse signal. The transistor is connected between the pulse creation circuit and an input portion of the gate circuit, to which the pulse signal is to be applied. Based on an output of the latch circuit, the transistor is controlled in conduction to transfer the pulse signal. The load circuit is connected between a power source and the input portion of the gate circuit, to which the pulse signal is applied by way of the transistor.

(9) According to the fourth aspect of this invention, the gate circuit corresponding to the column pre-decoder circuit is designed such that the latch circuit retains a state of an output signal which is previously output from the gate circuit, so the transistor is controlled in conduction in response to the latched signal. In addition, the pulse signal is applied to the input portion of the gate circuit by way of the transistor. Therefore, the output of the gate circuit is controlled in activation state based on the state of the latched signal and the pulse signal. For example, when the transistor is now placed in a non-conduction state, the input portion of the gate circuit is fixed in potential at a source voltage of the power source, so that the output of the gate circuit is not controlled by the pulse signal. On the other hand, when the transistor is placed in a conduction state, the pulse signal is applied to the input portion of the gate circuit, so the output of the gate circuit is to be controlled by the pulse signal. As described above, the column pre-decoder circuit configured by the multiple gate circuits is designed to retain states of the signals which are previously output therefrom, so it is possible to selectively fix a signal having a specific state in an inactivation state during the predetermined duration based on the retained states of the signals and the pulse signal.

Lastly, the effects of this invention can be repeated as follows:

(a) The semiconductor storage device is designed such that the column selecting transistors are controlled in non-conduction states for the predetermined duration when inputting the column address signals from the external. Therefore, the bit lines are not subjected to multiple selection, which is caused to occur in response to a changeover of the bit lines. Thus, it is possible to actualize the semiconductor storage device which is capable of avoiding deterioration of electric characteristics due to the multiple selection of the bit lines.

(b) The semiconductor storage device is designed to produce a pulse signal consisting of pulses each having a predetermined pulse width by detecting edges (i.e., leading edges or trailing edges) of pulses of the external clock signal. In addition, it inputs the column address signals in synchronization with the external clock signal so as to output signals, at least one of which is selectively activated. Further, the signals are fixed in inactivation states for the predetermined duration based on the pulse signals. Thus, it is possible to avoid occurrence of the multiple selection, which is caused to occur in response to a changeover of the bit lines.

(c) The semiconductor storage device is designed to retain a state of the previous column address signal, so it selectively fixes signals having specific states in inactivation states on the basis of the state of the previous column address signal as well as the pulse signal. Thus, it is possible to promptly perform selection of the bit lines, after a changeover of the column address signal, without being restricted by the pulse signal.

(d) The semiconductor storage device is equipped with a gate circuit which inputs the pulse signal and column address signal. Herein, an output signal of the gate circuit is latched based on the pulse signal, so that the pulse signal is input to the gate circuit based on the latched signal. Thus, it is possible to control an output state of the gate circuit by the pulse signal in response to a previous output state of a signal which is previously output from the gate circuit.

Finally, as this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A semiconductor storage device comprising:
    a memory cell array in which a plurality of memory cells are arranged in a matrix form using word lines and bit lines respectively corresponding to rows and columns, so that data are to be read from or written to a memory cell, which is specified by a row address and a column address respectively designated by a row address signal and a column address signal being input from an external in synchronization with an external clock signal, by way of data lines;
    a plurality of column selecting transistors, which are coupled between the bit lines and the data lines; and
    a column selection circuit for selectively controlling the column selecting transistors to be in non-conduction states during a predetermined duration when inputting the column address signal from the external, and when said data lines are precharging.

2. A semiconductor storage device according to claim 1 wherein the column selection circuit comprises
    a pulse creation circuit that creates a pulse signal comprising pulses, each pulse having a prescribed pulse width, upon detecting edges of the pulses of the external clock signal,
    a plurality of column address buffers for inputting column address signals from the external in synchronization with the external clock signal, in which the column address signals are converted to internal signals each having a predetermined logic level,
    a column pre-decoder circuit for inputting combinations of the internal signals output from the column address buffers so as to output signals, at least one of which is selectively activated, and
    a column decoder circuit for controlling the column selecting transistors to be selectively placed in a conduction state in response to the signals output from the column pre-decoder circuit,
    and wherein the column pre-decoder circuit fixes at least one of the signals thereof to be in an inactivation state during the predetermined duration on the basis of the pulse signal.

3. A semiconductor storage device according to claim 1 wherein the column selection circuit comprises
    a pulse creation circuit that creates a pulse signal comprising pulses, each pulse having a prescribed pulse width, upon detecting edges of the pulses of the external clock signal,
    a plurality of column address buffers for inputting column address signals from the external in synchronization with the external clock signal, in which the column address signals are converted to internal signals each having a predetermined logic level,
    a column pre-decoder circuit for inputting combinations of the internal signals output from the column address buffers so as to output signals, at least one of which is selectively activated, and
    a column decoder circuit for controlling the column selecting transistors to be selectively placed in a conduction state in response to the signals output from the column pre-decoder circuit,
    and wherein when the column address buffer inputs the column address signal from the external, the column pre-decoder circuit retains states of the signals being previously output therefrom, so that on the basis of the states of the signals and the pulse signal, a signal having a specific state within the signals is selectively fixed in an inactivation state during the predetermined duration.

4. A semiconductor storage device according to claim 3 wherein the column pre-decoder circuit has a plurality of gate circuits for inputting the pulse signal from the pulse creation circuit as well as the signals of the column address buffers, and wherein each of the gate circuits comprises
    a latch circuit used in said column pre-decoder circuit for latching an output of the gate circuit based on the pulse signal from the pulse creation circuit,
    a transistor, coupled between the pulse creation circuit and an input portion of the gate circuit to which the pulse signal is to be applied, so that the transistor is controlled in conduction based on an output of the latch circuit to transfer the pulse signal, and
    a load circuit which is coupled between a power source and the input portion of the gate circuit to which the pulse signal is applied by way of the transistor.

5. A semiconductor storage device comprising:
    a memory cell array on which a plurality of memory cells are arranged in a matrix form using word lines and bit lines respectively corresponding to rows and columns, which are designated based on address signals being given from an external;
    a row address buffer circuit for inputting the address signals in synchronization with an external clock signal to provide a row address signal;
    a row decoder circuit for decoding the row address signal to selectively activate a corresponding word line;
    a column address buffer circuit for inputting the address signals in synchronization with the external clock signal to provide a column address signal;
    a column address counter circuit for converting the column address signal to internal signals, which designate continuing column addresses of a prescribed burst length;

a column pre-decoder circuit for pre-decoding the internal signals in response to a pulse signal so as to produce column address pre-decode signals;

a column decoder circuit for decoding the column address pre-decode signals to produce column selecting signals;

a sense amplifier circuit consisting of a plurality of sense amplifiers, each of which is coupled with a pair of adjoining bit lines; and a plurality of column selecting transistors, each pair of which are respectively coupled between each pair of the adjoining bit lines and data lines by way of each sense amplifier and each pair of which are simultaneously controlled in conduction in response to each of the column selecting signals, wherein data are to be read from or written to the memory cells by way of the data lines, and said transistors are in a non-conductive state when inputting said addresses and balancing said data lines.

6. A semiconductor storage device according to claim 5 wherein the pulse signal is created based on a clock synchronization signal and a read-write signal.

7. A semiconductor storage device according to claim 5 wherein the column pre-decoder circuit retains states of the internal signals being previously output therefrom so as to inactivate the internal signals thereof during a predetermined duration substantially corresponding to a pulse width of a pulse of the pulse signal.

* * * * *